US011657888B1

(12) United States Patent
Xsiao

(10) Patent No.: US 11,657,888 B1
(45) Date of Patent: May 23, 2023

(54) TEST PLATFORM AND REDUNDANCY FUSE LATCH ANALYSIS METHOD THEREOF

(71) Applicant: NANYA TECHNOLOGY CORPORATION, New Taipei (TW)

(72) Inventor: Hung-Hsiang Xsiao, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 17/683,367

(22) Filed: Mar. 1, 2022

(51) Int. Cl.
G11C 29/38 (2006.01)
(52) U.S. Cl.
CPC .................................. G11C 29/38 (2013.01)
(58) Field of Classification Search
None
See application file for complete search history.

(56) References Cited

U.S. PATENT DOCUMENTS

| 7,401,270 | B2 | 7/2008 | Hummler |
| 7,484,116 | B2 | 1/2009 | Brey et al. |
| 10,115,479 | B2 | 10/2018 | Kim et al. |
| 2021/0055981 | A1* | 2/2021 | Miller ................... G11C 16/22 |

FOREIGN PATENT DOCUMENTS

| JP | 3198546 B2 * | 8/2001 | ............. G11C 29/00 |
| TW | I503826 | 10/2015 | |
| TW | 201942910 | 11/2019 | |

OTHER PUBLICATIONS

"Notice of allowance of Taiwan Counterpart Application", dated Aug. 10, 2022, p. 1-p. 4.

* cited by examiner

Primary Examiner — April Y Blair
Assistant Examiner — Matthew W Wahlin
(74) Attorney, Agent, or Firm — JCIPRNET

(57) ABSTRACT

The disclosure provides a test platform and a redundancy fuse latch analysis method. In a DRAM chip, a first redundant memory cell group is used to repair a failed memory cell group. The DRAM chip performs a write operation for a repaired address corresponding to the failed memory cell group, so as to write identification data corresponding to the repaired address into a second redundant memory cell group actually corresponding to the repaired address. The DRAM chip performs a read operation for a redundancy address corresponding to the repaired address to read the readout data from the first redundant memory cell group corresponding to the redundancy address. The test platform compares the readout data with the identification data to verify whether the first redundant memory cell group corresponding to the redundancy address and the second redundant memory cell group actually corresponding to the repaired address are the same one.

10 Claims, 3 Drawing Sheets

TEST PLATFORM AND REDUNDANCY FUSE LATCH ANALYSIS METHOD THEREOF

BACKGROUND

Technology Field

The disclosure relates to a memory test technology, and particularly relates to a test platform and a redundancy fuse latch analysis method thereof.

Description of Related Art

In a manufacturing process, a test platform can check whether the function of each memory cell in the main array of a dynamic random-access memory (DRAM) chip fails or not, and the test platform can record the row address and/or the column address of a failed memory cell. Redundancy is used to repair failed memory cells to improve the yield of DRAM chips. As memory density increases and chip size shrinks, redundancy becomes more and more important.

In the manufacturing process, the test platform can control the DRAM chip to enter the test mode to check whether the function of each redundant memory cell in the redundancy array of the DRAM chip fails or not. The redundant memory cells that pass the test can be used to repair the main array. The selection/addressing of redundancy is determined by the fuse circuit in the row decoder and/or in the column decoder. In the manufacturing process, the test platform can selectively "blow" one or more fuse circuits to select a redundant row to repair the failed memory cell row (or select a redundant column to repair the failed memory cell column). To reduce the space of the fuse circuit, a large number of fuse circuits are concentrated in the same area of the DRAM chip in order to share the fuse decoder and the fuse signal path. Row and column redundancy latch circuits are connected to the same fuse signal path to send all fuse information. Therefore, each redundancy latch circuit receives all fuse information.

Due to any unexpected factors, the redundancy latch circuit may latch incorrect fuse information. If the redundancy latch circuit latches the incorrect fuse information (unexpected redundant memory cell group repairs the failed memory cell group), the basic read and write function of the DRAM chip may be wrong. Generally speaking, the redundancy of a DRAM chip has 60,000 to 100,000 pieces of fuse information. DRAM manufacturers need to confirm whether the redundancy latch circuit latches correct fuse information before the sale. How to verify whether the fuse information latched by the redundancy latch circuit is correct, that is, to verify the correspondence between the redundant memory cell group of the redundancy array and the failed memory cell group of the main array, is one of many important issues in the field of DRAM technology.

It should be noted that the content of the "prior art" paragraph is used to help understand the disclosure. Part of the content (or all of the content) disclosed in the "prior art" paragraph may not be the conventional technology known to those with ordinary knowledge in the technical field. The content disclosed in the "prior art" paragraph does not mean that the content has been known to those with ordinary knowledge in the technical field before the application of the disclosure.

SUMMARY

The disclosure provides a test platform and a redundancy fuse latch analysis method thereof to verify correspondence between a redundant memory cell group of a redundancy array and a failed memory cell group of a main array in a dynamic random-access memory (DRAM) chip, that is to verify whether fuse information of the redundancy fuse latch in the DRAM chip is correct.

In an embodiment of the disclosure, the redundancy fuse latch analysis method is adapted for verifying correspondence between a first redundant memory cell group of a redundancy array and a failed memory cell group of a main array in a dynamic random-access memory (DRAM) chip. The first redundant memory cell group is used to repair the failed memory cell group. The redundancy fuse latch analysis method includes steps as follows. A write operation is performed for a repaired address corresponding to the failed memory cell group to write identification data corresponding to the repaired address into a second redundant memory cell group actually corresponding to the repaired address. A read operation is performed for a redundancy address corresponding to the repaired address to read readout data from the first redundant memory cell group corresponding to the redundancy address. The readout data is compared with the identification data to verify whether the first redundant memory cell group corresponding to the redundancy address and the second redundant memory cell group actually corresponding to the repaired address are the same one.

In an embodiment of the disclosure, the test platform is adapted for verifying correspondence between a first redundant memory cell group of a redundancy array and a failed memory cell group of a main array in a dynamic random-access memory (DRAM) chip. The first redundant memory cell group is used to repair the failed memory cell group. The test platform includes a storage device and a controller. The storage device stores a mapping table for recording a repaired address corresponding to the failed memory cell group and a redundancy address corresponding to the repaired address. The controller is coupled to the storage device to obtain the repaired address and the redundancy address from the mapping table. The controller controls the dynamic random-access memory chip to perform a write operation for the repaired address to write identification data corresponding to the repaired address into a second redundant memory cell group actually corresponding to the repaired address. The controller controls the dynamic random-access memory chip to perform a read operation for the redundancy address to read readout data from the first redundant memory cell group corresponding to the redundancy address. The controller compares the readout data with the identification data to verify whether the first redundant memory cell group corresponding to the redundancy address and the second redundant memory cell group actually corresponding to the repaired address are the same one.

In summary, the test platform in the embodiments of the disclosure can check whether the function of each memory cell group in the main array of the DRAM chip fails or not in the manufacturing process. The test platform can use the redundant memory cell group (the first redundant memory cell group) in the DRAM chip to repair the failed memory cell group of the main array, and the repaired address corresponding to the failed memory cell group and the redundancy address corresponding to the repaired address (the redundancy address of the first redundant memory cell group) are recorded in the mapping table. In some embodiments, the failed memory cell group may be a memory cell row and/or a memory cell column, and the repaired address may include a row address and/or a column address. The test platform can write the identification data corresponding to the repaired address into the redundant memory cell group (the second redundant memory cell group) actually corresponding to the repaired address, and then read data (the readout data) from the first redundant memory cell group corresponding to the redundancy address. When the fuse information blown in the DRAM chip is correct, the first redundant memory cell group corresponding to the redundancy address and the second redundant memory cell group actually corresponding to the repaired address be the same one, so the readout data and the identification data should be the same. When the fuse information blown in the DRAM chip is incorrect, that is, the first redundant memory cell group corresponding to the redundancy address is different from the second redundant memory cell group actually corresponding to the repaired address, then the readout data and the identification data should be different. Therefore, the test platform can compare the readout data with the identification data to verify the correspondence between the redundant memory cell group of the redundancy array and the failed memory cell group of the main array in the DRAM chip, that is, verify whether the fuse information of the redundancy fuse latch in the DRAM chip is correct.

In order to make the features and advantages of the disclosure comprehensible, embodiments accompanied with drawings are described in detail below.

DESCRIPTION OF THE EMBODIMENTS

Figure 1:
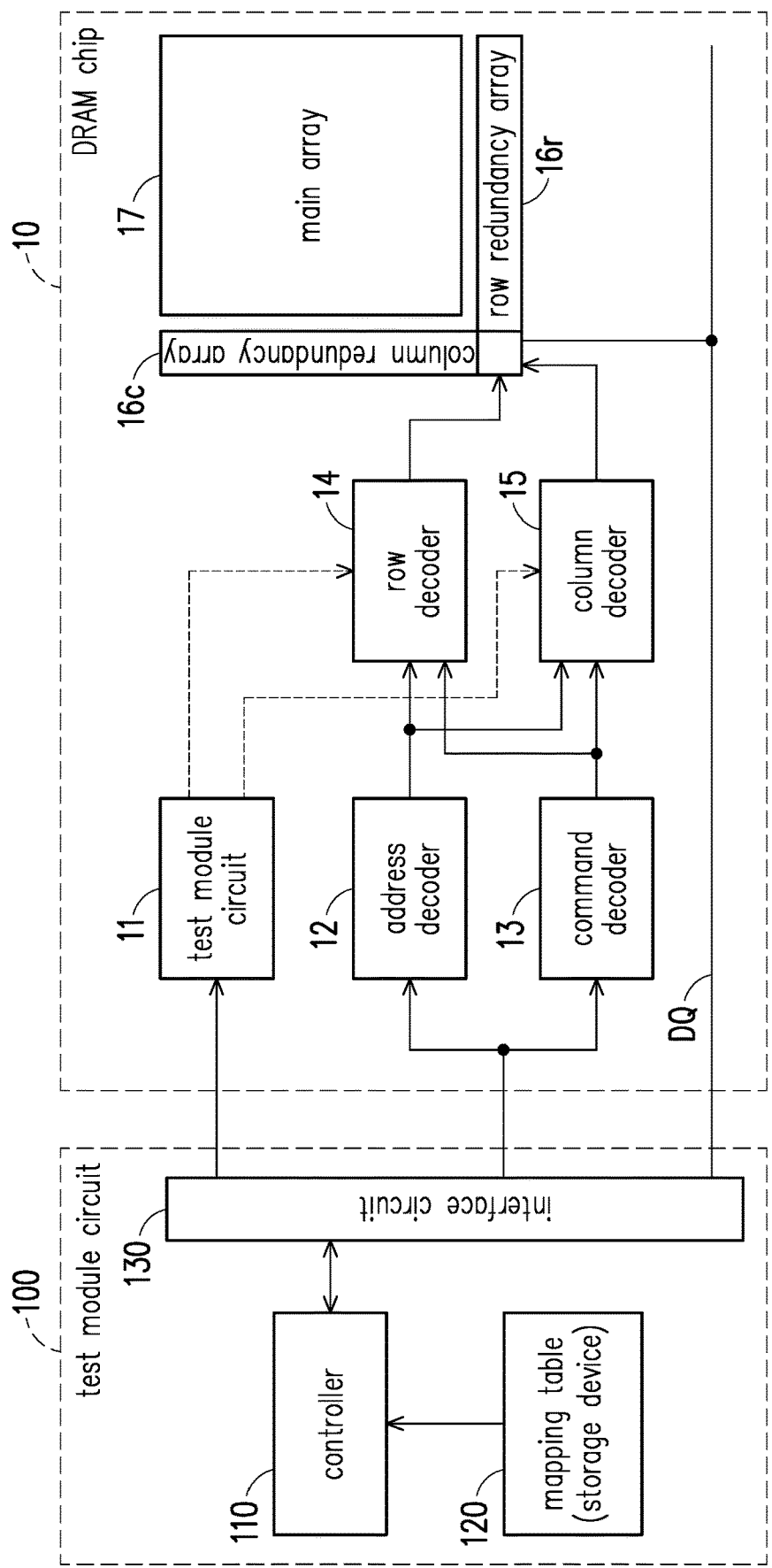
FIG. 1 is a schematic view of a circuit block of a test platform according to an embodiment of the disclosure.

The terms "couple/connect" used in this specification (including claims) may refer to any direct or indirect connection means. For example, "a first device is coupled (or connected) to a second device" should be interpreted as "the first device is directly connected to the second device" or "the first device is indirectly connected to the second device through other devices or connection means." The terms "first", "second", and so on used in this specification (including claims) are used to name the elements or distinguish different embodiments or ranges from each other, and should not be construed as the upper limit or lower limit of the number of the elements or as a limitation to the order of the elements. Moreover, wherever appropriate in the drawings and embodiments, elements/components/steps with the same reference numerals represent the same or similar parts. Elements/components/steps with the same reference numerals or names in different embodiments may be cross-referenced.

FIG. 1 is a schematic view of a circuit block of a test platform 100 according to an embodiment of the disclosure. In the application scenario shown in FIG. 1, a dynamic random-access memory (DRAM) chip 10 includes a test mode circuit 11, an address decoder 12, a command decoder 13, a row decoder 14, a column decoder 15, a column redundancy array 16c, a row redundancy array 16r, and a main array 17. The front-end circuit (e.g., the test platform 100 or a memory controller not shown) can send commands with logical addresses to the address decoder 12 and the command decoder 13 in a normal operation mode. The command decoder 13 can output a command decoding result to the row decoder 14 and the column decoder 15. For example, the command decoder 13 can convert input commands and address signals into DRAM control signals (e.g., "active", "write", "read", "precharge" or other DRAM operation control signals). The address decoder 12 can output the logical address decoding result to the row decoder 14 and the column decoder 15. For example, the address decoder 12 can convert input commands and address signals into internal column addresses or row addresses.

Based on the decoding results of the address decoder 12 and the command decoder 13, the row decoder 14 and the column decoder 15 can control the column redundancy array 16c, the row redundancy array 16r, and the main array 17. For example, the row decoder 14 can decode the row address and the control signal "active" to turn on a corresponding word line WL. In another example, the column decoder 15 can decode the column address and the control signal "write" to send data from a global data path DQ to multiple memory cells of the turned-on word line WL. In yet another example, the column decoder 15 can decode the column address and the control signal "read" so that data is sent from the memory cells of the turned-on word line WL to the global data path DQ.

The main array 17 may include primary column address cells and primary row address cells. For the sake of conciseness, the connection lines between the main array 17 and other circuits (e.g., the row decoder 14 and the column decoder 15) are not illustrated in FIG. 1. Based on the operation of the row decoder 14 and the column decoder 15, the front-end circuit (e.g., the test platform 100 or the memory controller not shown) can access the column redundancy array 16c, the row redundancy array 16r, and the main array 17 through the global data path DQ. The row redundancy array 16r may include redundancy row address cells and all column address cells. The column redundancy array 16c may include all row address cells and redundancy column address cells.

The test platform 100 is adapted for verifying the correspondence between the redundant memory cell group (a first redundant memory cell group) of the redundancy array in the DRAM chip 10 and the failed memory cell group of the main array 17, and the first redundant memory cell group is used to repair the failed memory cell group. According to actual design, the redundancy array may include the column redundancy array 16c and/or the row redundancy array 16r, the first redundant memory cell group may be a redundant memory cell column in the column redundancy array 16c or a redundant memory cell row in the row redundancy array 16r, and the failed memory cell group may be a memory cell column or a memory cell row in the main array 17.

In the manufacturing process, the test platform 100 can control the test mode circuit 11 of the DRAM chip 10 so that the DRAM chip 10 enters a test mode. In the test mode, the test platform 100 can check whether the function of each redundant memory cell in the redundancy array of the DRAM chip 10 fails or not. For example, in the test mode, the test mode circuit 11 can control the row decoder 14 and the column decoder 15 to select/address any redundant memory cell column in the column redundancy array 16c and any redundant memory cell row in the row redundancy array 16r, and the test platform 100 can access/test any redundant memory cell in the redundancy array through the global data path DQ. The failed redundant memory cells may be masked (not used). The redundant memory cells that pass the test can be used to repair the main array 17.

In the manufacturing process, the test platform 100 can check whether the function of each memory cell in the main array 17 of the DRAM chip 10 fails or not, and the address (e.g., the row address and/or the column address) of the failed memory cell is recorded. The redundant memory cells in the column redundancy array 16c and the row redundancy array 16r are used to repair the failed memory cells in the main array 17 to improve the yield of the DRAM chip 10. The selection/addressing of the redundant memory cell row and/or the redundant memory cell column is determined by the fuse circuit (not shown) in the row decoder 14 and/or in the column decoder 15.

In the embodiment shown in FIG. 1, the test platform 100 includes a controller 110, a storage device, and an interface circuit 130. This embodiment does not limit the specific implementation of the storage device. The storage device may be any type of storage means. For example, in some embodiments, the storage device may be a random access memory (RAM), a read only memory (ROM), a FLASH memory, or other semiconductor memory (or logic circuit). In other embodiments, the storage device may be a hard disk drive (HDD), a solid-state drive (SSD), or other storage device. The storage device stores a mapping table 120 for recording the repaired address corresponding to the failed memory cell group and the redundancy address corresponding to the repaired address. The controller 110 is coupled to the storage device (mapping table 120). The controller 110 can check whether the function of each memory cell in the main array 17 of the DRAM chip 10 fails or not through the interface circuit 130, and the row address and/or the column address of the failed memory cell is recorded in the mapping table 120. The controller 110 may select a redundant memory cell column in the column redundancy array 16c to repair a failed memory cell column in the main array 17, and then the repaired address of the failed memory cell column and the redundancy address of the selected redundant memory cell column are recorded in the mapping table 120; and (or) the controller 110 may select the redundant memory cell row in the row redundancy array 16r to repair a failed memory cell row in the main array 17, and then the repaired address of the failed memory cell row and the redundancy address of the selected redundant memory cell row are recorded in the mapping table 120.

In the process of repairing failed memory cells, the test platform 100 can selectively "blow" one or more fuse circuits (not shown) in the row decoder 14 and/or in the column decoder 15 to select a redundant memory cell row to repair a failed memory cell row (or select a redundant memory cell column to repair a failed memory cell column). Due to any unexpected factors, the fuse circuits may latch incorrect fuse information. Incorrect fuse information may cause errors in the basic read and write functions of the DRAM chip 10. For example, the test platform 100 can use the redundant memory cell row "Rred1" (not shown) in the row redundancy array 16r to repair a certain failed memory cell row "Rm1" (not shown) in the main array 17, but because of incorrect fuse information, this failed memory cell row may, in fact, correspond to another redundant memory cell row "Rred2" (not shown). The redundant memory cell row "Rred2" may have other uses. For example, the redundant memory cell row "Rred2" is used by the test platform 100 to repair another failed memory cell row "Rm2" (not shown) in the main array 17. In such a case, an error may happen to the basic read and write functions of the DRAM chip 10.

Figure 2:
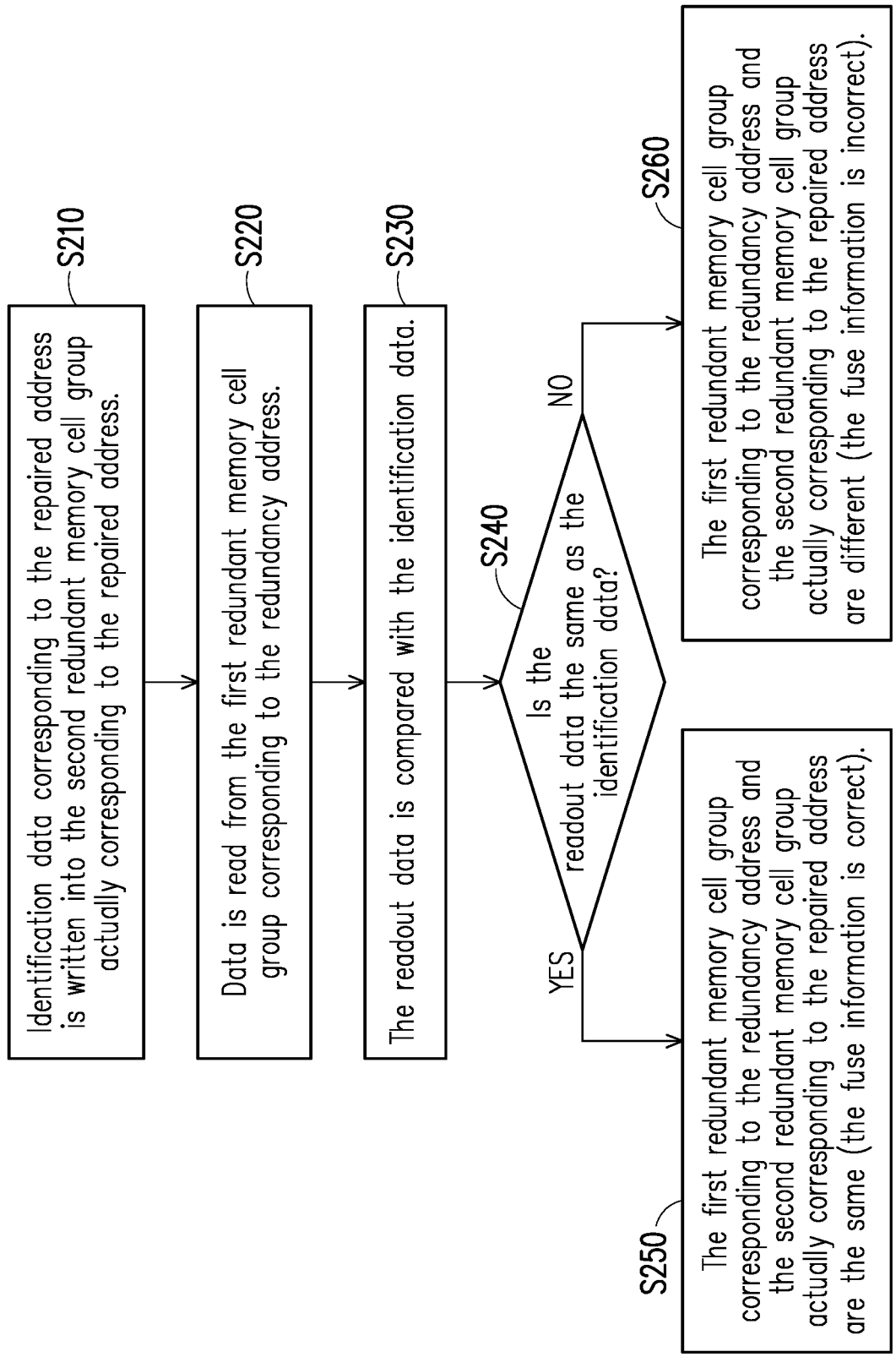
FIG. 2 is a flowchart illustrating a redundancy fuse latch analysis method according to an embodiment of the disclosure.

FIG. 2 is a flowchart illustrating a redundancy fuse latch analysis method according to an embodiment of the disclosure. Referring to FIG. 1 and FIG. 2, the redundancy fuse latch analysis method shown in FIG. 2 is adapted for verifying the correspondence (the repair relationship) between the first redundant memory cell group of the redundancy array (e.g., the column redundancy array 16c and/or the row redundancy array 16r) in the DRAM chip 10 and the failed memory cell group of the main array 17, where the first redundant memory cell group has been selected to repair the failed memory cell group. In the process of repairing the failed memory cell, the correspondence between the first redundant memory cell group and the failed memory cell group has been recorded in the mapping table 120 of the test platform 100. The controller 110 is coupled to the storage device to obtain the repaired address of the failed memory cell group and the redundancy address of the first redundant memory cell group from the mapping table 120.

The controller 110 can obtain the repaired address and the redundancy address that have the correspondence from the mapping table 120. In step S210, the controller 110 can control the DRAM chip 10 to perform a write operation for a repaired address corresponding to the failed memory cell group, and identification data corresponding to the repaired address is written into a redundant memory cell group (the second redundant memory cell group) actually corresponding to the repaired address. In step S220, the controller 110 can control the DRAM chip 10 to perform a read operation for a redundancy address corresponding to the repaired address to read data (hereinafter referred to as the readout data) from the first redundant memory cell group corresponding to the redundancy address. In step S230, the controller 110 may compare the readout data with the identification data to verify whether the first redundant memory cell group corresponding to the redundancy address and the second redundant memory cell group actually corresponding to the repaired address are the same one.

For example, in some embodiments, the repaired address includes a row address (e.g., "Rm3") corresponding to the failed memory cell, the identification data includes the row address "Rm3", and the second redundant memory cell group actually corresponding to the repaired address includes a redundant memory cell row. The controller 110 may obtain the row address "Rm3" (the repaired address) and the redundancy address (e.g., "Rred3") having the correspondence from the mapping table 120. The controller 110 can enter the normal operation mode to write the row address "Rm3" (identification data) into the redundant memory cell row (the second redundant memory cell group) actually corresponding to the row address "Rm3". Next, the controller 110 can enter the test mode to read data (the readout data) from the redundant memory cell row (the first redundant memory cell group) corresponding to the redundancy address "Rred3". The controller 110 can compare the readout data with the row address "Rm3" (the repaired address) to verify whether the "first redundant memory cell group" corresponding to the redundancy address "Rred3" and the "second redundant memory cell group" actually corresponding to the repaired address "Rm3" are the same one.

In other embodiments, the repaired address includes a column address (e.g., "Cm3") corresponding to the failed memory cell, the identification data includes the row address "Cm3", and the second redundant memory cell group actually corresponding to the repaired address includes a redundant memory cell column. The controller 110 may obtain the row address "Cm3" (the repaired address) and the redundancy address (e.g., "Cred3") having correspondence from the mapping table 120. The controller 110 can enter the normal operation mode to write the column address "Cm3" (the identification data) into the redundant memory cell column (the second redundant memory cell group) actually corresponding to the column address "Cm3". Next, the controller 110 may enter the test mode to read data (the readout data) from the redundant memory cell column (the first redundant memory cell group) corresponding to the redundancy address "Cred3". The controller 110 can compare the readout data with the column address "Cm3" (the repaired address) to verify whether the "first redundant memory cell group" and the "second redundant memory cell group" actually corresponding to the repaired address "Cm3" are the same one.

When the readout data is the same as the identification data (the determining result of step S240 is "Yes"), the controller 110 may proceed to step S250, that is, it is determined that the first redundant memory cell group corresponding to the redundancy address and the second redundant memory cell group actually corresponding to the repaired address are the same one (the fuse information is correct). When the readout data is different from the identification data (the determining result of step S240 is "No"), the controller 110 may proceed to step S260, that is, it is determined that the first redundant memory cell group corresponding to the redundancy address and the second redundant memory cell group actually corresponding to the repaired address are different (the fuse information is incorrect).

In summary, the test platform 100 of the embodiment can check the chip to be tested (e.g., the DRAM chip 10) in the manufacturing process. The test platform 100 can check whether the function of each memory cell group (the memory cell row or the memory cell column) in the main array 17 of the DRAM chip 10 fails or not. The test platform 100 can select the redundant memory cell group (the first redundant memory cell group) in the redundancy array of the DRAM chip 10 to repair the failed memory cell group of the main array 17, and the repaired address corresponding to the failed memory cell group and the redundancy address corresponding to the repaired address (the redundancy address of the first redundant memory cell group) are recorded in the mapping table. In some embodiments, the repaired address may include a row address and/or a column address, and the "redundant memory cell group in the redundancy array" may be a redundant memory cell column in the column redundancy array 16c or a redundant memory cell row in the row redundancy array 16r. The test platform 100 can write the identification data (e.g., the column address and/or the row address corresponding to the failed memory cell group) corresponding to the repaired address into the redundant memory cell group (the second redundant memory cell group) actually corresponding to the repaired address in the normal operation mode of the DRAM chip 10, and then in the test mode of the DRAM chip 10, data (i.e., the readout data) is read from the first redundant memory cell group corresponding to the redundancy address.

When the fuse information blown in the DRAM chip 10 is correct, the first redundant memory cell group corresponding to the redundancy address and the second redundant memory cell group actually corresponding to the repaired address should be the same one, so the readout data and the identification data should be the same. When there is an error in the fuse information blown in the DRAM chip 10, that is, the first redundant memory cell group corresponding to the redundancy address is different from the second redundant memory cell group actually corresponding to the repaired address, then the readout data and the identification data should be different. Therefore, the test platform 100 can compare the readout data with the identification data to verify the correspondence between the redundant memory cell group of the redundancy array in the DRAM chip 10 and the failed memory cell group of the main array, that is, verify whether the fuse information of the redundancy fuse latch in the DRAM chip 10 is correct.

For example, assuming that the mapping table 120 records the correspondence between a row address "Rm4" (a repaired address) of the main array 17 and a redundancy address "Rred4" of the row redundancy array 16r, it means that the redundant memory cell row (the first redundant memory cell group) indicated by the redundancy address "Rred4" in the row redundancy array 16r is selected by the test platform 100 to repair the memory cell array (the failed memory cell group) indicated by the row address "Rm4" in the main array 17. In the normal operation mode of the DRAM chip 10, the test platform 100 can write the identification data (e.g., "Rm4") into the redundant memory cell row (the second redundant memory cell group) actually corresponding to the row address "Rm4", and then in the test mode of the DRAM chip 10, data is read from the redundant memory cell row corresponding to the redundancy address "Rred4". When the fuse information blown in the DRAM chip 10 is correct, the redundant memory cell row (the second redundant memory cell group) actually corresponding to the row address "Rm4" should be the redundant memory cell row (the first redundant memory cell group) corresponding to the redundancy address "Rred4", and therefore the readout data and the identification data should be the same. When there is an error in the fuse information blown in the DRAM chip 10, the redundant memory cell row (the second redundant memory cell group) actually corresponding to the row address "Rm4" is not the redundant memory cell array (the first redundant memory cell group) corresponding to the redundancy address "Rred4", and therefore the readout data and the identification data should be different.

In another example, assuming that the mapping table 120 records the correspondence between the column address "Cm4" (the repaired address) of the main array 17 and the redundancy address "Cred4" of the column redundancy array 16c, it means that the redundant memory cell column (the first redundant memory cell group) indicated by the redundancy address "Cred4" in the column redundancy array 16c is selected by the test platform 100 to repair the memory cell column (the failed memory cell group) indicated by the column address "Cm4" in the main array 17. In the normal operation mode of the DRAM chip 10, the test platform 100 can write the identification data (e.g., "Cm4") into the redundant memory cell column (the second redundant memory cell group) actually corresponding to the column address "Cm4"(the repaired address), and then in the test mode of the DRAM chip 10, data is read from the redundant memory cell column corresponding to the redundancy address "Cred4". When the fuse information blown in the DRAM chip 10 is correct, the redundant memory cell column (the second redundant memory cell group) actually corresponding to the column address "Cm4" should be the redundant memory cell column (the first redundant memory cell group) corresponding to the redundancy address "Cred4", and therefore the readout data and the identification data should be the same. When there is an error in the fuse information blown in the DRAM chip 10, the redundant memory cell column (the second redundant memory cell group) actually corresponding to the column address "Cm4"

is not the redundant memory cell column (the first redundant memory cell group) corresponding to the redundancy address "Cred4", and therefore the readout data and the identification data should be different.

Figure 3:
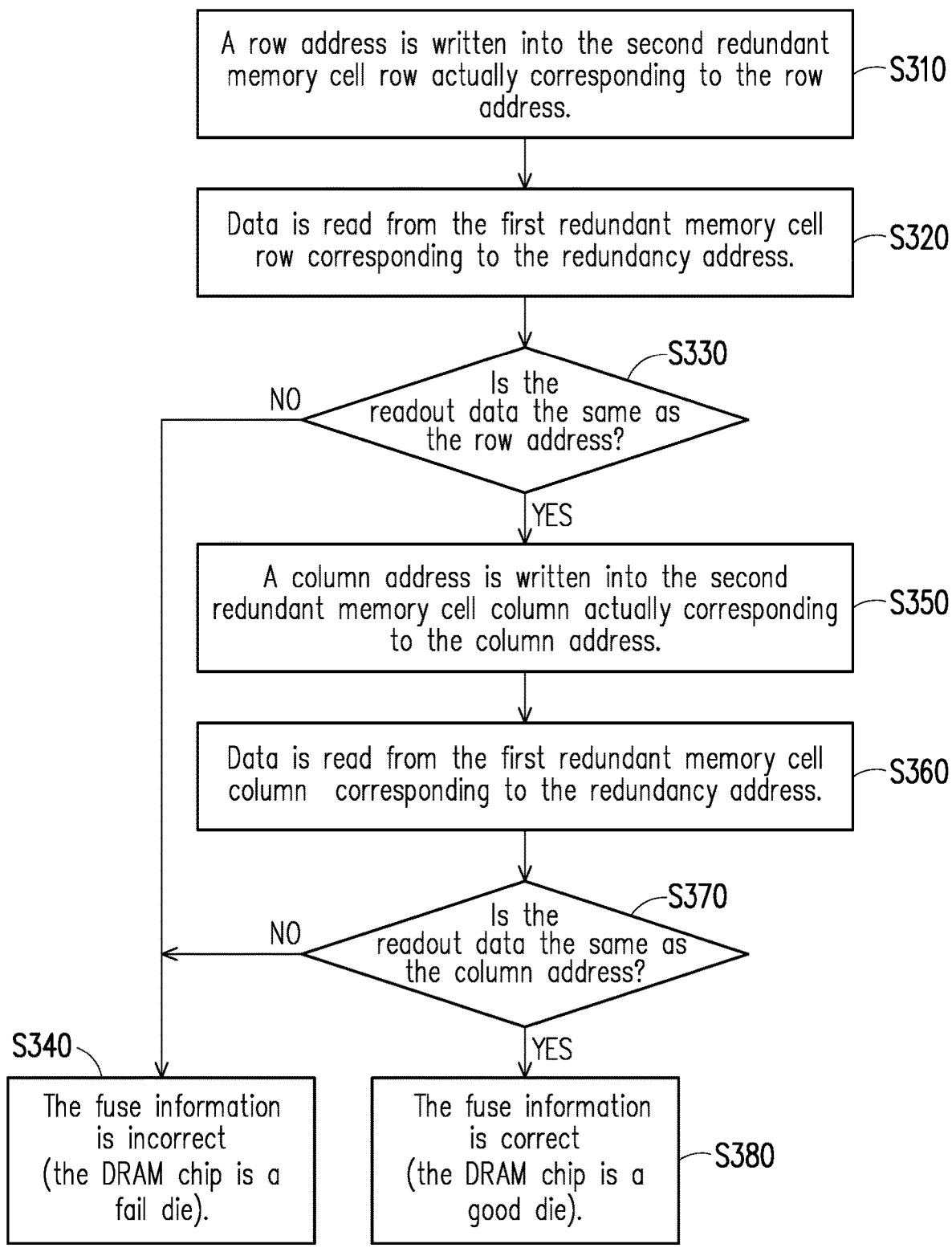
FIG. 3 is a flowchart illustrating a redundancy fuse latch analysis method according to another embodiment of the disclosure.

FIG. 3 is a flowchart illustrating a redundancy fuse latch analysis method according to another embodiment of the disclosure. Referring to FIG. 1 and FIG. 3, the redundancy fuse latch analysis method shown in FIG. 3 is adapted for verifying the correspondence (the repair relationship) between the redundancy array (e.g., the column redundancy array 16c and/or the row redundancy array 16r) and the main array 17 in the DRAM chip 10. From the mapping table 120, the controller 110 can obtain the repaired addresses of the failed memory cell group (e.g., the failed memory cell row or the failed memory cell column) in the main array 17 and the redundancy address of the first redundant memory cell group (e.g., redundant memory cell row or redundant memory cell column) in the redundancy array.

The controller 110 may allow the DRAM chip 10 to enter the normal operation mode (step S310). In the normal operation mode, the controller 110 can control the DRAM chip 10 to perform a write operation for a row address (a repaired address) corresponding to the failed memory cell row in the main array 17 to write a row address (identification data) into a redundant memory cell row (the second redundant memory cell group) actually corresponding to the row address (step S310). Next, the controller 110 may allow the DRAM chip 10 to enter the test mode (step S320). In the test mode, the controller 110 can control the DRAM chip 10 to perform a read operation for a redundancy address corresponding to the row address (the repaired address) to read data from a redundant memory cell row (the first redundant memory cell group) corresponding to the redundancy address (step S320). In step S330, the controller 110 may compare the readout data with the row address to verify whether they are the same. When the readout data is different from the row address (the determining result of step S330 is "No"), the controller 110 may proceed to step S340, that is, determine that the fuse information of the DRAM chip 10 is incorrect. Accordingly, the DRAM chip 10 is determined as a fail die.

For example, assuming that the mapping table 120 records the correspondence between a row address "Rm5" (a repaired address) of the main array 17 and a redundancy address "Rred5" of the row redundancy array 16r, it means that the redundant memory cell row (the first redundant memory cell group) indicated by the redundancy address "Rred5" in the row redundancy array 16r is selected by the test platform 100 to repair the memory cell array (the failed memory cell group) indicated by the row address " Rm5" in the main array 17. In the normal operation mode of the DRAM chip 10, the test platform 100 can write "Rm5" (the identification data) into the redundant memory cell row (the second redundant memory cell group) actually corresponding to the row address "Rm5" (the repaired address) (step S310), and then in the test mode of the DRAM chip 10, data is read from the redundant memory cell row corresponding to the redundancy address "Rred5" (step S320). When there is an error in the fuse information blown in the DRAM chip 10, the redundant memory cell row (the second redundant memory cell group) actually corresponding to the row address "Rm5" is not the redundant memory cell array (the first redundant memory cell group) corresponding to the redundancy address "Rred5", and therefore the readout data in step S320 and "Rm5" (the identification data) should be different. When the fuse information blown in the DRAM chip 10 is correct, the redundant memory cell row actually corresponding to the row address "Rm5" should be the redundant memory cell row corresponding to the redundancy address "Rred5", and therefore the readout data in step S320 and "Rm5" should be the same.

When the readout data is the same as the row address (the identification data) (the determining result of step S330 is "Yes"), the controller 110 may proceed to step S350. The controller 110 may allow the DRAM chip 10 to enter the normal operation mode again (step S350). In the normal operation mode, the controller 110 can control the DRAM chip 10 to perform a write operation for the column address (the repaired address) corresponding to the failed memory cell column in the main array 17 to write the column address (the identification data) into a redundant memory cell column (the second redundant memory cell group) actually corresponding to the column address (step S350). Next, the controller 110 may allow the DRAM chip 10 to enter the test mode again (step S360). In the test mode, the controller 110 can control the DRAM chip 10 to perform a read operation for the redundancy address corresponding to the column address (the repaired address) to read data from a redundant memory cell column (the first redundant memory cell group) corresponding to the redundancy address (step S360).

In step S370, the controller 110 can compare the readout data with the column address (the identification data) to verify whether they are the same. When the readout data is different from the column address (the determining result of step S370 is "No"), the controller 110 can proceed to step S340, that is, determine that the fuse information of the DRAM chip 10 is incorrect. Accordingly, the DRAM chip 10 is determined as a fail die. When the readout data is the same as the column address (the identification data) (the determining result of step S370 is "Yes"), the controller 110 can proceed to step S380, that is, determine that the fuse information of the DRAM chip 10 is correct. Accordingly, the DRAM chip 10 is determined as a good die.

For example, assuming that the mapping table 120 records the correspondence between the column address "Cm5" (the repaired address) of the main array 17 and the redundancy address "Cred5" of the column redundancy array 16c, it means that the redundant memory cell column (the first redundant memory cell group) indicated by the redundancy address "Cred4" in the column redundancy array 16c is selected by the test platform 100 to repair the memory cell column (the failed memory cell group) indicated by the column address "Cm5" in the main array 17. In the normal operation mode of the DRAM chip 10, the test platform 100 can write identification data (e.g., "Cm5") into the redundant memory cell column (the second redundant memory cell group) corresponding to the column address "Cm5" (the repaired address) (step S350), and then in the test mode of the DRAM chip 10, data is read from the redundant memory cell column corresponding to the redundancy address "Cred5" (step S360). When the fuse information blown in the DRAM chip 10 is correct, the redundant memory cell column corresponding to the column address "Cm5" should be the redundant memory cell column corresponding to the redundancy address "Cred5", and therefore the readout data in step S360 and "Cm5" (the identification data) should be the same. When there is an error in the fuse information blown in the DRAM chip 10, the redundant memory cell column corresponding to the column address "Cm5" is not the redundant memory cell column corresponding to the redundancy address "Cred5", so the readout data in step 5360 and "Cm5" should be different.

Row redundancy is first verified and then column redundancy is verified in the embodiment shown in FIG. 3. In any case, the embodiments of the disclosure are not limited to FIG. 3. For example, in other embodiments, the test platform 100 may first verify the column redundancy and then verify the row redundancy for the DRAM chip 10.

In summary, the test platform 100 described in the embodiment can be applied to any redundancy repair. No matter what redundancy repair it is, the test platform 100 can easily find the corresponding repair address after the redundant latch. The test platform 100 can easily find the redundancy of the latch error fuse information. The test platform 100 can be applied regardless of the redundancy design that the DRAM chip 10 adopts.

According to different design requirements, the controller 110 may be implemented in form of hardware, firmware, software (i.e., program), or combinations thereof. In terms of hardware, the controller 110 may be implemented in a logic circuit on an integrated circuit. Related functions of the controller 110 may be implemented as hardware by using hardware description languages (for example, Verilog HDL or VHDL) or other suitable programming languages. For example, the related functions of the controller 110 may be implemented in one or more controllers, microcontrollers, microprocessors, application-specific integrated circuits (ASIC), digital signal processor (DSP), field programmable gate array (FPGA) and/or various logic blocks, modules and circuits in other processing units.

In terms of software and/or firmware, the related functions of the controller 110 may be implemented as programming codes. For example, general programming languages (such as C, C++, or assembly language) or other suitable programming languages are used to implement the controller 110. The programming code can be recorded/stored in a "non-transitory computer readable medium". In some embodiments, the non-transitory computer readable medium includes, for example, Read Only Memory (ROM), tape, disk, card, semiconductor memory, and programming logic circuits and/or storage devices. The storage device includes a hard disk drive (HDD), a solid-state drive (SSD) or other storage devices. A computer, a central processing unit (CPU), a controller, a microcontroller, or a microprocessor can read and execute the programming code from the non-transitory computer readable medium, thereby realizing the related functions of the controller 110. Moreover, the programming code can also be provided to the computer (or CPU) via any transmission medium (communication network or broadcast wave, etc.). The communication network is, for example, the Internet, a wired communication network, a wireless communication network, or other communication media.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A redundancy fuse latch analysis method, adapted for verifying correspondence between a first redundant memory cell group of a redundancy array and a failed memory cell group of a main array in a dynamic random-access memory (DRAM) chip, wherein the first redundant memory cell group is used to repair the failed memory cell group, and the redundancy fuse latch analysis method comprises:

performing a write operation for a repaired address corresponding to the failed memory cell group to write identification data corresponding to the repaired address into a second redundant memory cell group actually corresponding to the repaired address;

performing a read operation for a redundancy address corresponding to the repaired address to read readout data from the first redundant memory cell group corresponding to the redundancy address; and comparing the readout data with the identification data to verify whether the first redundant memory cell group corresponding to the redundancy address and the second redundant memory cell group actually corresponding to the repaired address are the same one.

2. The redundancy fuse latch analysis method according to claim 1, wherein the repaired address comprises a row address, the identification data comprises the row address, the second redundant memory cell group comprises a redundant memory cell row, and the redundancy fuse latch analysis method further comprises:

performing the write operation for the row address to write the row address into the redundant memory cell row actually corresponding to the row address; and comparing the readout data with the row address to verify whether the first redundant memory cell group corresponding to the redundancy address and the second redundant memory cell group actually corresponding to the repaired address are the same one.

3. The redundancy fuse latch analysis method according to claim 1, wherein the repaired address comprises a column address, the identification data comprises the column address, the second redundant memory cell group comprises a redundant memory cell column, and the redundancy fuse latch analysis method further comprises:

performing the write operation for the column address to write the column address into the redundant memory cell column actually corresponding to the column address; and comparing the readout data with the column address to verify whether the first redundant memory cell group corresponding to the redundancy address and the second redundant memory cell group actually corresponding to the repaired address are the same one.

4. The redundancy fuse latch analysis method according to claim 1, further comprising:

allowing the DRAM chip to enter a normal operation mode; and performing the write operation for the repaired address corresponding to the failed memory cell group in the normal operation mode.

5. The redundancy fuse latch analysis method according to claim 1, further comprising:

allowing the DRAM chip to enter a test mode; and performing the read operation for the redundancy address corresponding to the repaired address in the test mode.

6. A test platform, adapted for verifying correspondence between a first redundant memory cell group of a redundancy array and a failed memory cell group of a main array in a dynamic random-access memory (DRAM) chip, wherein the first redundant memory cell group is used to repair the failed memory cell group, and the test platform comprises:

a storage device storing a mapping table for recording a repaired address corresponding to the failed memory cell group and a redundancy address corresponding to the repaired address; and a controller coupled to the storage device to obtain the repaired address and the redundancy address from the mapping table, wherein the controller controls the DRAM chip to perform a write operation for the repaired address to write identification data corresponding to the repaired address into a second redundant memory cell group actually corresponding to the repaired address;

the controller controls the DRAM chip to perform a read operation for the redundancy address to read readout data from the first redundant memory cell group corresponding to the redundancy address; and the controller compares the readout data with the identification data to verify whether the first redundant memory cell group corresponding to the redundancy address and the second redundant memory cell group actually corresponding to the repaired address are the same one.

7. The test platform according to claim 6, wherein the repaired address comprises a row address, the identification data comprises the row address, and the second redundant memory cell group comprises a redundant memory cell row, wherein the controller controls the DRAM chip to perform the write operation for the row address to write the row address into the redundant memory cell row actually corresponding to the row address; and the controller compares the readout data with the row address to verify whether the first redundant memory cell group corresponding to the redundancy address and the second redundant memory cell group actually corresponding to the repaired address are the same one.

8. The test platform according to claim 6, wherein the repaired address comprises a column addresses, the identification data comprises the column addresses, and the second redundant memory cell group comprises a redundant memory cell column, wherein the controller controls the DRAM chip to perform the write operation for the column address to write the column address into the redundant memory cell column actually corresponding to the column address; and the controller compares the readout data with the column address to verify whether the first redundant memory cell group corresponding to the redundancy address and the second redundant memory cell group actually corresponding to the repaired address are the same one.

9. The test platform according to claim 6, wherein the controller controls the DRAM chip to enter a normal operation mode; and the controller controls the DRAM chip to perform the write operation for the repaired address corresponding to the failed memory cell group in the normal operation mode.

10. The test platform according to claim 6, wherein the controller controls the DRAM chip to enter a test mode; and the controller controls the DRAM chip to perform the read operation for the redundancy address corresponding to the repaired address in the test mode.

\* \* \* \* \*